US007172914B1

(12) United States Patent
Narayanan

(10) Patent No.: US 7,172,914 B1
(45) Date of Patent: Feb. 6, 2007

(54) METHOD OF MAKING UNIFORM OXIDE LAYER

(75) Inventor: Sundar Narayanan, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 751 days.

(21) Appl. No.: 09/753,011

(22) Filed: Jan. 2, 2001

(51) Int. Cl.
*H01L 21/00* (2006.01)
*H01L 21/337* (2006.01)
*H01L 21/8238* (2006.01)
*H01L 21/331* (2006.01)
*H01L 21/76* (2006.01)

(52) U.S. Cl. .................. 438/38; 438/39; 438/40; 438/41; 438/42; 438/43; 438/196; 438/207; 438/218; 438/219; 438/221; 438/225; 438/294; 438/295; 438/296; 438/318; 438/353; 438/355; 438/359; 438/400

(58) Field of Classification Search ............. 438/359, 438/435, 424, 689, 221
See application file for complete search history.

(56) References Cited

U.S. PATENT DOCUMENTS

| | | | | |
|---|---|---|---|---|
| 4,666,556 A * | 5/1987 | Fulton et al. | ............. | 438/431 |
| 5,661,091 A * | 8/1997 | Duinkerken et al. | | |
| 5,950,102 A * | 9/1999 | Lee | ............. | 257/522 |
| 5,994,201 A * | 11/1999 | Lee | | |
| 6,001,708 A * | 12/1999 | Liu et al. | ............. | 438/435 |
| 6,117,748 A * | 9/2000 | Lou et al. | ............. | 438/400 |
| 6,133,144 A * | 10/2000 | Tsai et al. | ............. | 257/758 |
| 6,159,821 A * | 12/2000 | Cheng et al. | ............. | 438/424 |
| 6,180,502 B1 * | 1/2001 | Liang | ............. | 438/595 |
| 6,187,650 B1 * | 2/2001 | Wu et al. | | |
| 6,238,997 B1 * | 5/2001 | Chen et al. | ............. | 438/400 |
| 6,261,914 B1 * | 7/2001 | Divakaruni et al. | ........ | 438/359 |
| 6,274,419 B1 * | 8/2001 | Omid-Zohoor et al. | | |
| 6,274,434 B1 * | 8/2001 | Koido et al. | | |
| 6,291,331 B1 * | 9/2001 | Wang et al. | ............. | 438/618 |
| 6,319,794 B1 * | 11/2001 | Akatsu et al. | ............. | 438/424 |
| 6,391,784 B1 * | 5/2002 | Ibok | ............. | 438/404 |
| 6,399,462 B1 | 6/2002 | Ramkumar et al. | | |
| 6,410,403 B1 * | 6/2002 | Wu | ............. | 438/424 |
| 2002/0005582 A1 * | 1/2002 | Nogami et al. | ............. | 257/758 |
| 2002/0022308 A1 * | 2/2002 | Ahn et al. | ............. | 438/164 |
| 2002/0110994 A1 * | 8/2002 | Hong et al. | ............. | 438/424 |
| 2003/0032260 A1 | 2/2003 | Ahn et al. | | |

FOREIGN PATENT DOCUMENTS

JP          10-289990          * 10/1998

OTHER PUBLICATIONS

Encyclopedia of Chemical Technology, Kirk-Othmer, vol. 14, pp. 677-709 (1995).
Microchip Fabrication 4th Edition, Peter Van Zant, McGraw-Hill, 2000, pp. 491-527.

* cited by examiner

*Primary Examiner*—Carl Whitehead, Jr.
*Assistant Examiner*—James M. Mitchell
(74) *Attorney, Agent, or Firm*—Evan Law Group LLC

(57) ABSTRACT

A method of forming a semiconductor structure includes forming an isolation region in a semiconductor substrate. A first oxide layer is on the substrate, a first sacrificial layer is on the first oxide layer, and a first nitride layer is on the first sacrificial layer. The first oxide layer may be a screen oxide layer, and the method provides consistency in the thickness of the screen oxide layer.

19 Claims, 4 Drawing Sheets

METHOD OF MAKING UNIFORM OXIDE LAYER

BACKGROUND

The present invention relates to methods of forming oxides layers in semiconductor structures.

A widely used isolation technique in semiconductor structures is silicon trench isolation (STI), shown in FIG. 5. A field oxide 4 narrows into an oxide layer 10 on a silicon substrate 2. FIGS. 1–4 illustrate the steps used to prepare the structure shown in FIG. 5. Thermal oxidizing forms an oxide layer ($SiO_2$) 10 on the silicon substrate 2, followed by depositing a silicon nitride ($Si_3N_4$) layer (isolation nitride) 6 using low pressure chemical vapor deposition (LPCVD) to form the structure shown in FIG. 1. Next, a photoresist layer 12 is applied, and patterned using a mask. Etching of those portions of the silicon nitride layer, thermal oxide and silicon substrate not covered by the photoresist layer, in a single operation, opens a trench 14, giving the structure shown in FIG. 2.

The photoresist layer is then stripped, and the substrate is cleaned. An oxide layer 16 is then deposited into the trench and across the surface of the structure by chemical vapor deposition (CVD), producing the structure shown in FIG. 3. Chemical-mechanical polishing (CMP) planarizes the surface, leaving the oxide layer 16 only in the trench, as shown in FIG. 4. The silicon nitride layer is removed, to produce the structure shown in FIG. 5. Typically, further processing will include ion implantation through the oxide layer 10, using it as a screen oxide, to form source/drain regions, and then removal of the screen oxide followed by growth of a gate oxide layer on the silicon substrate. At this point, completion of a semiconductor device, by the formation of gates, contacts, metallization, etc., may be carried out, and the semiconductor device may then be incorporated into an electronic device.

During CMP to planarize the surface of the structure, the center to edge uniformity across the wafer is very poor. Consequently, the thickness of the silicon nitride layer varies across the wafer. The silicon nitride layer is typically removed by etching with a phosphoric acid etch. Since the etch is continued for a time sufficient to remove the nitride layer, over etching is necessary to ensure that all of the silicon nitride is removed. Furthermore, during LPCVD silicon nitride is deposited on both the front and back sides of the wafer; over etching is necessary to ensure remove of the silicon nitride on the back side of the wafer, to avoid interference with the stepper.

The silicon nitride/silicon oxide selectivity of the silicon nitride etching changes as the bath of phosphoric acid is used. A fresh phosphoric acid bath will etch silicon oxide slowly, and as the bath is used, the rate of etching of silicon oxide will slow down, stop and eventually begin to deposit oxide. The thickness of the oxide layer (typically used as a screen oxide during ion implantation) is usually 125 Å when initially formed, will have a variable thickness at the end of this process, depending on the age of the phosphoric acid bath used during the etching of the silicon nitride layer, and the amount of over etching. The variable thickness of the screen oxide will affect the formation of the source/drain regions, leading to inconsistent threshold voltages (Vt) for the transistors formed on the wafer.

BRIEF SUMMARY

In a first aspect, the present invention is a method of forming a semiconductor structure, including forming an isolation region in a semiconductor substrate. A first oxide layer is on the substrate, a first sacrificial layer is on the first oxide layer, and a first nitride layer is on the first sacrificial layer.

In a second aspect, the present invention is a method of forming a semiconductor structure, including removing a first nitride layer and a first sacrificial layer. A first oxide layer is on a substrate, the first sacrificial layer is on the first oxide layer, and the first nitride layer is on the first sacrificial layer.

In a third aspect, the present invention is a method of forming a semiconductor device from either of these structures.

In a fourth aspect, the present invention is a method of forming an electronic device from this semiconductor device.

The term "oxide" refers to a metal oxide conventionally used to isolate electrically active structures in an integrated circuit from each other, typically an oxide of silicon and/or aluminum (e.g., $SiO_2$ or $Al_2O_3$, which may be conventionally doped with fluorine, boron, phosphorous or a mixture thereof; preferably $SiO_2$ or $SiO_2$ conventionally doped with 1–12 wt % of phosphorous and 0–8 wt % of boron).

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION

Figure 1:
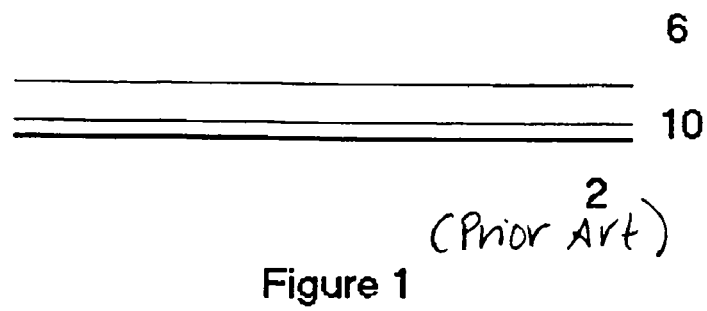
FIGS. 1–4 illustrate the formation of a silicon trench isolation region.
Figure 2:
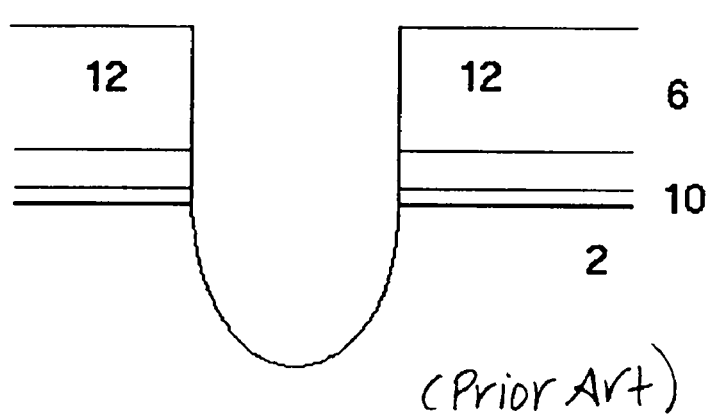
Figure 3:
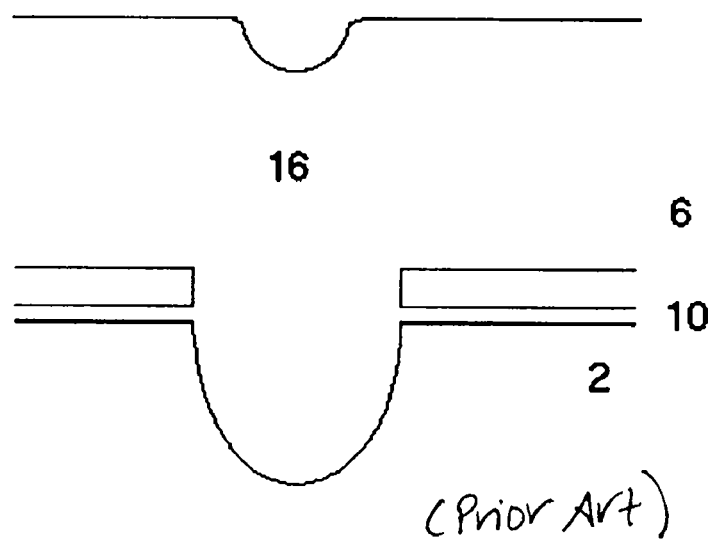
Figure 4:
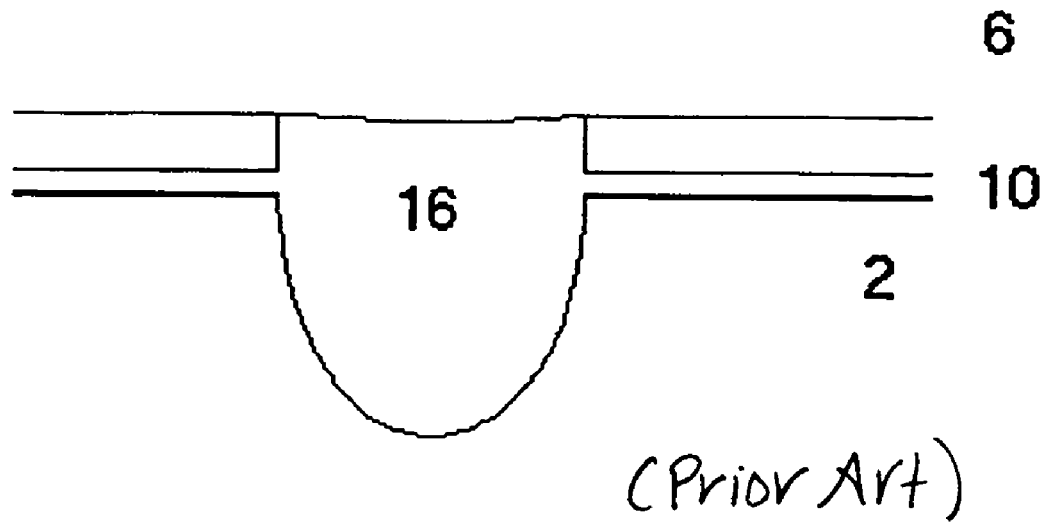
Figure 5:
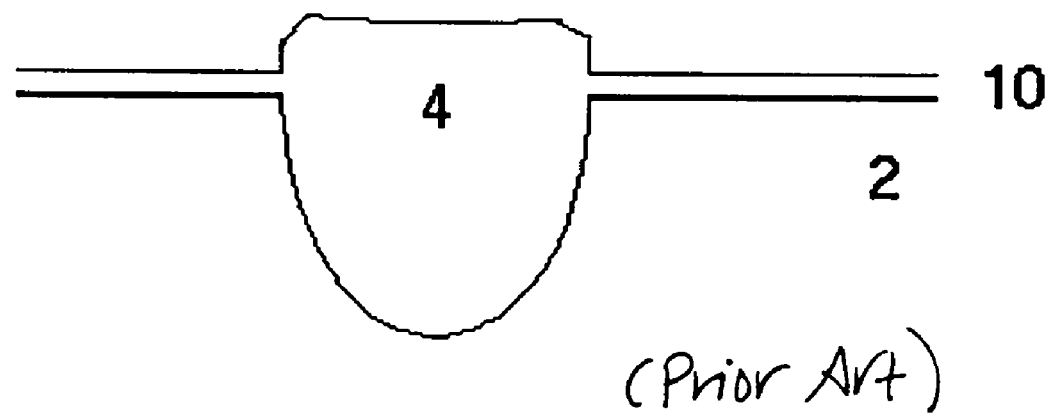
FIG. 5 shown a silicon trench isolation region.
Figure 6:
FIGS. 6–11 illustrate an embodiment of the present invention.

The present invention includes a first sacrificial layer on the screen oxide layer, and optionally, a second sacrificial layer between the first sacrificial layer, and the screen oxide layer. The first sacrificial layer acts as a sacrificial layer during the silicon nitride etch, providing a stopping point for the etch, but any damage to this layer will be irrelevant since it is subsequently remove. This layer is then removed, as well as the optional second sacrificial layer. Since the sacrificial layer (or layers) is relatively thin, only a small amount of damage is possible to the screen oxide layer, ensuring a more consistent thickness and therefore a consistent Vt for the semiconductor device.

The first sacrificial layer may be made from any material that will act as an etch stop for silicon nitride. For example, the first sacrificial layer may include silicon (such as polycrystalline silicon), tungsten, tungsten silicide, or titanium nitride. The second sacrificial layer may be made from any material that can be selectively etched over silicon oxide. For example, the second sacrificial layer may include silicon (such as polycrystalline silicon), tungsten, tungsten silicide, or titanium nitride. If the second sacrificial layer is not present, then the first sacrificial layer must also be able to be selectively etched over silicon oxide. In a preferred embodiment, both the first and second sacrificial layers are present. More preferably, the first sacrificial layer includes silicon oxide ($SiO_2$), and the second sacrificial layer comprises silicon nitride ($Si_3N_4$).

Preferably, the sacrificial layer (or layers) is thinner than the isolation nitride layer. More preferably, the first sacrificial layer has a thickness of 5 to 1000 Å, more preferably 10 to 250 Å, most preferably 20 to 100 Å, for example 50 Å. More preferably, the second sacrificial layer has a thickness of 5 to 1000 Å, more preferably 10 to 500 Å, most preferably 30 to 200 Å, for example 100 Å. The screen oxide preferably has a thickness of 5 to 1000 Å, more preferably 10 to 500 Å, most preferably 30 to 200 Å, for example 125 Å. The isolation nitride layer preferably has a thickness of 100 to 20,000 Å, more preferably 200 to 10,000 Å, most preferably 500 to 4000 Å, for example 1950 Å.

An embodiment of the present invention is illustrated in FIGS. 6–11. First, thermal oxidation of a silicon substrate forms a screen oxide 110, followed by LPCVD of a second sacrificial layer 120, containing silicon nitride. CVD of a first sacrificial layer 118, containing silicon oxide, onto the second sacrificial layer 120 is then followed by LPCVD of an isolation nitride layer 106. This forms the structure shown in FIG. 6.

Figure 7:
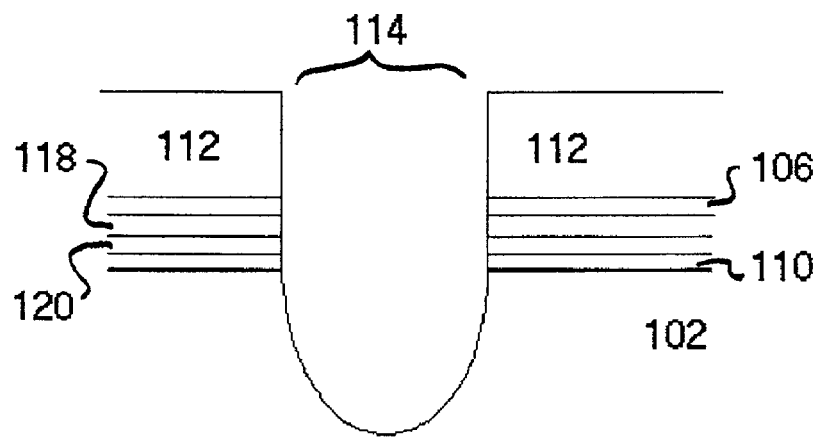
Figure 8:
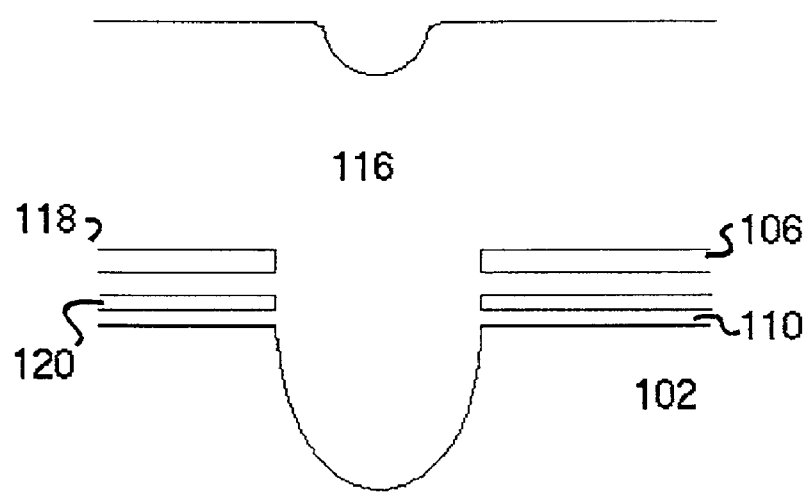

A photoresist layer 112 is applied, and patterned. The isolation nitride layer, both sacrificial layers, the screen oxide layer, and the substrate, are etched, to form a trench 114. The resulting structure is illustrated in FIG. 7. The field isolation dielectric 116, preferably an oxide, is applied across the substrate, filling the trench, to form the structure shown in FIG. 8.

Figure 9:
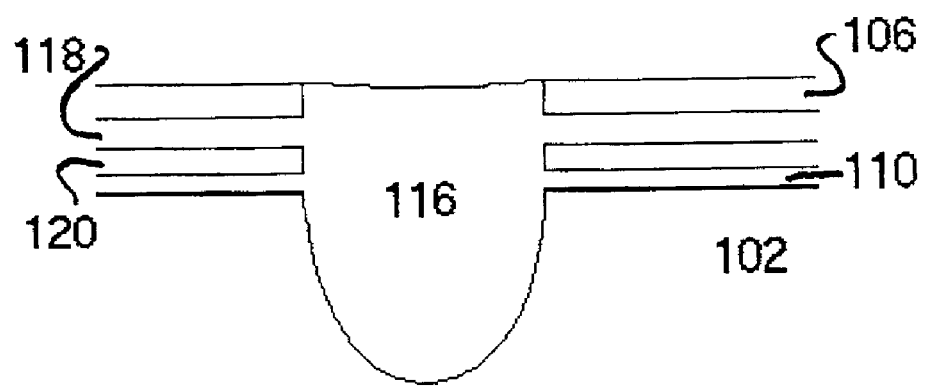
Figure 10:
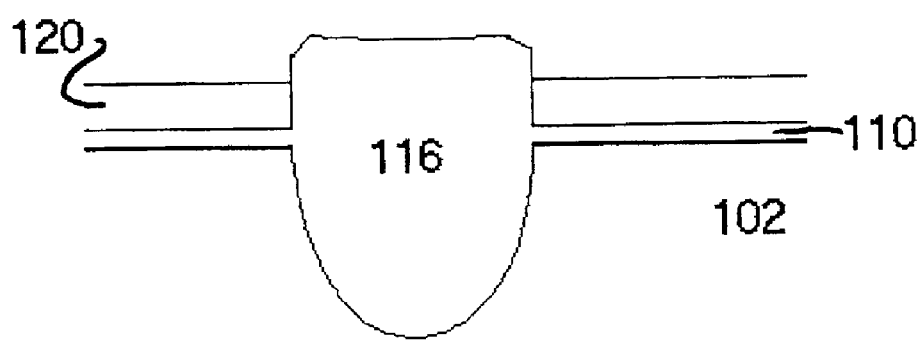

CMP is used to bring the surface of the field isolation dielectric 116 down to the level of the isolation nitride 106, as illustrated in FIG. 9. Then the isolation nitride 106 is removed, by etching with phosphoric acid. Over etching may be used to ensure removal of all of the isolation nitride across the substrate, as well as any nitride present on the back of substrate. An etchant, such as hydrofluoric acid, may then be used to remove the first sacrificial layer 118, to produce the structure shown in FIG. 10.

Figure 11:
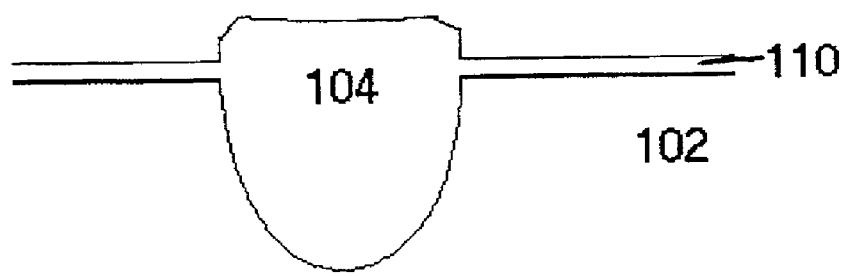

The second sacrificial layer 120, is removed, by etching with phosphoric acid. Preferably, this layer is much thinner than the isolation nitride layer, and has not been subjected to CMP, and therefore no over etching, or very little over etching, is necessary in order to completely remove this layer. The structure of FIG. 11 is then formed, with a screen oxide 110 have a very consistent thickness; the thickness will be very close to the thickness with which it was originally formed. Preferably, the thickness will deviate by no more than 30 Å (+/−30 Å), more preferably by no more than 20 Å (+/−20 Å), most preferably by no more than 10 Å (+/−10 Å), from the thickness with which it was originally formed. Preferably, the thickness will deviate by no more than 25%, more preferably by no more than 15%, most preferably by no more than 10%, from the thickness with which it was originally formed.

In the case where only a single sacrificial layer is present, such as a polycrystalline silicon layer, the structure shown in FIG. 11 would be formed directly after etching the isolation nitride layer and the sacrificial layer. The single sacrificial layer would protect the underlying screen oxide layer from damage during the etching of the isolation nitride layer.

The present invention may be used in conjunction with any method of forming an isolation region, as long as an isolation nitride is used in the process. Such methods may be modified to use the present invention by including a sacrificial layer between the substrate and the isolation nitride layer. Preferably, two sacrificial layers are used, more preferably, the first sacrificial layer is an oxide layer and the second sacrificial layer is a nitride layer between the substrate and the first sacrificial layer. Examples of other methods of forming isolation regions include those described in application Ser. Nos. 09/505,737 and 08/885,046.

The individual processing steps, including etching and deposition steps, for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; Wolf, Silicon Processing for the VLSI Era, Lattice Press, 1986, 1990, 1995 (vols 1–3, respectively), and Microchip Fabrication 3rd. edition, Peter Van Zant, McGraw-Hill, 1997. The isolation nitride, as well as the first or second sacrificial layers when they include nitride, may be formed by CVD, preferably LPCVD or plasma enhanced CVD (PECVD).

When nitride, oxide and/or sacrificial layers are removed, they are selectively etched, and the layer they are on acts as the etch stop layer. Preferably, the etch selectivity (i.e., the ratio of (a) the rate of dielectric etching to (b) the rate of etch stop material etching) is at least 2:1, preferably at least 3:1, more preferably at least 5:1 and even more preferably at least 10:1. In the case of etching silicon oxide using silicon nitride as the etch-stop layer, an etching solution of one part HF(49%) in one part deionized water will give a selectivity of greater than 1:300.

The substrate may typically be a semiconductor material conventionally known by those of ordinary skill in the art. Examples include silicon, gallium arsenide, germanium, gallium nitride, aluminum phosphide, and alloys such as $Si_{1-x}Ge_x$ and $Al_xGa_{1-x}As$, where 0×1. Many others are known, such as those listed in Semiconductor Device Fundamentals, on page 4, Table 1.1 (Robert F. Pierret, Addison-Wesley, 1996). Preferably, the semiconductor substrate is silicon, which may be doped or undoped.

The structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

Obviously, numerous modifications and variations of the present invention are possible in light of the above teachings. It is therefore to be understood that within the scope of the appended claims, the invention may be practiced otherwise than as specifically described herein.

The invention claimed is:

1. A method of forming a semiconductor structure, comprising:
    providing a semiconductor substrate, wherein
        a first oxide layer is on said substrate,
        a first sacrificial layer is on said first oxide layer, wherein said first sacrificial layer comprises an oxide, and
        a first nitride layer is on said first sacrificial layer; followed by
    forming an isolation region in said substrate, wherein said forming an isolation region comprises:
        etching a trench into said substrate; and
        filing said trench with said oxide;
    wherein a second sacrificial layer is between said first sacrificial layer and said first oxide layer,
    wherein said first sacrificial layer comprises silicon oxide, said second sacrificial layer comprises silicon nitride, said isolation region comprises an oxide, and said substrate comprises silicon.

2. The method of claim 1, further comprising:
removing said first nitride layer;
removing said first sacrificial layer; and
removing said second sacrificial layer.

3. The method of claim 2, further comprising implanting ions in said substrate through said first oxide layer.

4. A method of forming a semiconductor device, comprising:
forming a semiconductor structure by the method of claim 3; and
forming a semiconductor device from said semiconductor structure.

5. A method of forming an electronic device, comprising:
forming a semiconductor device by the method of claim 4; and
forming an electronic device, comprising said semiconductor device.

6. The method of claim 1, wherein said first and second sacrificial layers each have a thickness less than the thickness of said first nitride layer.

7. The method of claim 6, wherein
said first sacrificial layer has a thickness of 10 to 250 Å; and
said second sacrificial layer has a thickness of 10 to 500 Å.

8. A method of forming a semiconductor device, comprising:
forming a semiconductor structure by the method of claim 1; and
forming a semiconductor device from said semiconductor structure.

9. A method of forming an electronic device, comprising:
forming a semiconductor device by the method of claim 8; and
forming an electronic device, comprising said semiconductor device.

10. The method of claim 1, wherein said forming an isolation region comprises depositing an oxide onto said first nitride layer and into a trench adjacent to said first nitride layer, said first sacrificial layer, and said first oxide layer.

11. The method of claim 1, further comprising, prior to said forming said isolation region:
forming said first oxide layer on said substrate by thermal oxidation;
forming said second sacrificial layer on said first oxide layer by CVD;
forming said first sacrificial layer on said second sacrificial layer by CVD; and
forming said first nitride layer on said first sacrificial layer by CVD.

12. A method of forming a semiconductor structure, comprising:
providing a semiconductor substrate, wherein
a first oxide layer is supported by said substrate,
a first sacrificial layer is supported by said first oxide layer, wherein said first sacrificial layer comprises an oxide, and
a first nitride layer is supported by said first sacrificial layer; followed by
forming an isolation region in said substrate, wherein said forming an isolation region comprises:
etching a trench into said substrate; and
filing said trench with said oxide,
wherein a second sacrificial layer is between said first sacrificial layer and said first oxide layer.

13. A method of forming a semiconductor device, comprising:
forming a semiconductor structure by the method of claim 12; and
forming a semiconductor device from said semiconductor structure.

14. A method of forming an electronic device, comprising:
forming a semiconductor device by the method of claim 12; and
forming an electronic device, comprising said semiconductor device.

15. A method of forming a semiconductor structure, comprising:
providing a semiconductor substrate, wherein
a first oxide layer is on said substrate,
a first sacrificial layer is on said first oxide layer, wherein said first sacrificial layer comprises an oxide, and
a first nitride layer is on said first sacrificial layer; followed by
forming an isolation region in said substrate, wherein said forming an isolation region comprises:
etching a trench into said substrate; and
filing said trench with said oxide;
wherein a second sacrificial layer is between said first sacrificial layer and said first oxide layer,
wherein said first sacrificial layer comprises silicon oxide, said second sacrificial layer comprises silicon nitride, said isolation region comprises an oxide, and said substrate comprises silicon, and
said first and second sacrificial layers each have a thickness less than the thickness of said first nitride layer.

16. The method of claim 1, further comprising, prior to said forming said isolation region:
forming said first oxide layer on said substrate by thermal oxidation;
forming said second sacrificial layer on said first oxide layer by CVD;
forming said first sacrificial layer on said second sacrificial layer by CVD; and
forming said first nitride layer on said first sacrificial layer by CVD.

17. The method of claim 15, wherein
said first sacrificial layer has a thickness of 10 to 250 Å; and
said second sacrificial layer has a thickness of 10 to 500 Å.

18. The method of claim 15, wherein a second sacrificial layer is between said first sacrificial layer and said first oxide layer.

19. A method of forming a semiconductor structure, comprising:
providing a semiconductor substrate, wherein
a first oxide layer is supported by said substrate,
a first sacrificial layer is supported by said first oxide layer, wherein said first sacrificial layer comprises an oxide, and
a first nitride layer is supported by said first sacrificial layer; followed by
forming an isolation region in said substrate, wherein said forming an isolation region comprises:
etching a trench into said substrate; and
filing said trench with said oxide,
wherein a second sacrificial layer is between said first sacrificial layer and said first oxide layer, and
said first sacrificial layer is in contact with said first nitride layer.

* * * * *

UNITED STATES PATENT AND TRADEMARK OFFICE
CERTIFICATE OF CORRECTION

| | | |
|---|---|---|
| PATENT NO. | : 7,172,914 B1 | Page 1 of 1 |
| APPLICATION NO. | : 09/753011 | |
| DATED | : February 6, 2007 | |
| INVENTOR(S) | : Sundar Narayanan | |

It is certified that error appears in the above-identified patent and that said Letters Patent is hereby corrected as shown below:

In the claims:
Claim 1 Col. 4, line 64, please delete "filing" and insert --filling--.
Claim 12 Col. 5, line 63, please delete "filing" and insert --filling--.
Claim 14 Col. 6, line 6, please delete "12" and insert --13--.
Claim 15 Col. 6, line 21, please delete "filing" and insert --filling--.
Claim 15 Col. 6, line 30, please delete "1" and insert --15--.
Claim 19 Col. 6, line 60, please delete "filing" and insert --filling--.

Signed and Sealed this

Thirteenth Day of November, 2007

JON W. DUDAS
*Director of the United States Patent and Trademark Office*